PIEZOELECTRIC SEMICONDUCTOR ACOUSTIC WAVE SIGNAL DEVICE

Filed Oct. 24, 1966

INVENTOR.
DALE F. CRISLER
BY
Carpenter, Kinney & Coulter
ATTORNEYS 3,428,907

PIEZOELECTRIC SEMICONDUCTOR ACOUSTIC WAVE SIGNAL DEVICE

Dale F. Crisler, Rice Lake, Wis., assignor to Minnesota Mining and Manufacturing Company, St. Paul, Minn., a corporation of Delaware Filed Oct. 24, 1966, Ser. No. 588,997
U.S. Cl. 330—5.5 16 Claims
Int. Cl. H03f 3/04, 15/00

ABSTRACT OF THE DISCLOSURE

A zinc oxide piezoelectric semiconductor acoustic amplifier and delay line with a high resistivity and a relatively high Hall mobility each of which varies inversely as a function of temperature.

This invention relates to a piezoelectric semiconductor acoustic wave signal device for producing acoustic wave signal amplification and more particularly relates to an ultrasonic wave signal amplifier utilizing a zinc oxide single crystal as the amplifying medium wherein the zinc oxide crystal is selected to have a high resistivity and a relatively high Hall mobility each of which vary inversely as a function of temperature.

Use of a piezoelectric semiconductor as an amplifying medium for producing ultrasonic wave signal amplification is known. For example, an ultrasonic wave signal amplifier using cadmium sulfide and gallium arsenide as the amplifying medium is disclosed in Patent No. 3,173,-100. In another Patent No. 3,240,962, gallium arsenide is used as a piezoelectric transducer in an ultrasonic delay line. Each of the above patents alleged that a zinc oxide crystal could be used as the amplifying medium. However, prior to the present invention, a successful acoustic wave signal amplifier utilizing a zinc oxide single crystal as the amplifying medium had not been achieved. Based on the prior art, it was not feasible to utilize zinc oxide crystals as the amplifying medium due to the inherent and undesirable physical characteristics of a relatively low Hall mobility at high resistivity.

The term "Hall mobility" designated by the term "$\mu_h$" when used herein is defined by the expression $$\mu_h=\frac{V_H L_A 10^8}{V_A L_H B}$$

where $V_H$=the Hall effect voltage,
$V_A$=the voltage along the length of a sample,
$L_H$=the length of a sample,
$L_A$=the cross-sectional width of a sample,
$B$=the flux density of the magnetic field applied to measure the Hall mobility.

The Hall mobility unit designation is cm./sec. per volt/cm., otherwise referred to as cm.$^2$/V-sec. The Hall mobility designates the mobility of carriers, whether electrons or holes in a semiconductor, which is unaffected by electron traps and the like.

The term "drift mobility" designated by the term "$\mu_e$" when used herein is defined by the expression $$\mu_e=\frac{\sigma}{ne}$$

where $\sigma$=the conductivity,
$e$=the charge of the carriers,
$n$=the number-density.

The drift mobility unit designation is cm./sec. per volt/cm., otherwise referred to as cm.$^2$/V-sec. The drift mobility designates the mobility of carriers, whether electrons or holes in a semiconductor, under the influence of an electric field. Generally, the Hall mobility and drift mobility are nearly the same at high temperatures, say in the order of room temperature, and are significantly separated at lower temperatures, say in the order of −100° C.

The term "drift velocity" designated by the term $v_d$ is to be understood as defined by the expression $$v_d=\mu_e E$$

where $\mu_e$=the drift mobility,
E=the electric field in volts/cm.

The drift velocity unit designation is cm./sec. The drift velocity generally designates the velocity of the carriers, whether electrons or holes in a semiconductor, under the influence in an electric field having a particular magnitude per unit length of material.

Theoretical calculations disclose that a zinc oxide crystal, if properly selected, can be used as a piezoelectric semiconductor transducer having high gain in decibels per unit length as indicated by the above patents. This invention now makes it possible to construct an ultrasonic wave signal amplifier using a properly-selected amplifying medium, such as a zinc oxide crystal, for producing relatively high amplification of an ultrasonic wave signal.

Based upon the teachings of this invention, a zinc oxide crystal having a high resistivity and a relatively high Hall mobility each of which vary as an inverse function of temperature can be selected as the amplifying medium to produce a high gain ultrasonic wave signal amplifier. The present invention provides a means for amplifying ultrasonic or ultra high frequencies, say for example in the range of about 100 megacycles per second (m.c.p.s.) to two kilomegacycles per second (kmc.p.s.) and higher frequencies. Such an ultra high frequency signal amplifier has tremendous potential in the communications field and the like.

One advantage of this invention is that a piezoelectric semiconductor transducer having an amplifying medium selected to have a high resistivity and relatively high Hall mobility each of which vary inversely as a function of temperature can be utilized to amplify an acoustic wave signal.

Another advantage of the present invention is that an ultrasonic wave signal amplifier can be produced using a zinc oxide crystal formed into a unitary body as the amplifying medium.

Yet another advantage of the present invention is that a zinc oxide crystal resistivity and Hall mobility can be controlled to produce maximum amplification of an acoustic wave signal at a particular frequency.

A further advantage of the present invention is that an ultra high frequency signal amplifier utilizing a zinc oxide crystal formed into a unitary body can amplify an acoustic wave signal derived from an ultra high frequency electrical signal whereby amplification of the acoustic wave signal occurs when a direct current field is applied across the crystal in coincidence with the acoustic wave signal propagating through the crystal.

Still another advantage of the present invention is that the piezoelectric semiconductor transducer can be used as a low loss ultrasonic or acoustic wave signal delay line.

These and other advantages of the present invention will become apparent when considered in light of the following description of a preferred embodiment taken together with the drawing wherein.

Briefly, this invention relates to a piezoelectric semiconductor device for producing acoustic wave signal amplification. The device includes an amplifying medium having both piezoelectric and semiconductor properties and which is formed into a unitary body. The amplifying medium exhibits a high resistivity and relatively high Hall mobility each of which vary inversely as a function of temperature. A means for propagating an acoustic wave signal through the amplifying medium produces a piezoelectric field in a predetermined direction within the medium. A means operatively coupled to the medium coincidently applies a direct current field across the medium in the same predetermined direction as the piezoelectric field established by the acoustic wave signal propagating through the body. The piezoelectric field interacts with the direct current field to amplify the acoustic wave signal propagating therethrough.

Figure 1:
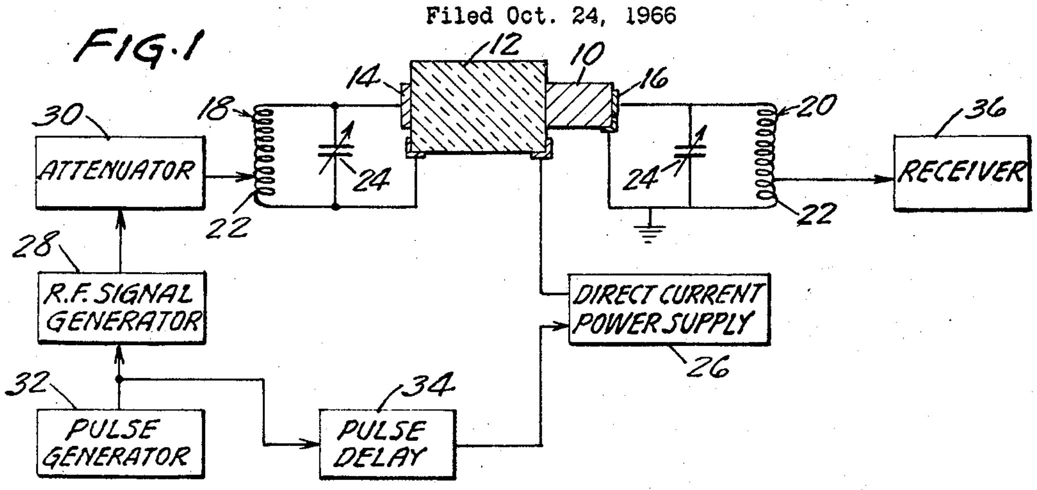
FIGURE 1 is a block diagram and partial schematic diagram illustrating one embodiment of the present invention.

A typical piezoelectric semiconductor ultrasonic amplifier or ultrasonic wave signal amplifier is illustrated in FIGURE 1. The amplifying medium in this particular embodiment is a single crystal zinc oxide wafer 10. The zinc oxide crystal 10 is a Z cut wafer from a bulk zinc oxide single crystal. The zinc oxide crystal is adapted to have the acoustic wave signal to be amplified propagated in the compression mode along its *c*-axis.

The zinc oxide crystal 10 is bonded to a quartz or silicon dioxide ($SiO_2$) buffer rod 12 by means of an epoxy resin bond capable of withstanding temperatures in the order of −100° C. A zinc oxide input transducer 14 and a zinc oxide output transducer 16 are bonded by means of high shear epoxy bond to the buffer rod 12 and the zinc oxide crystal 10 respectively. Impedance matching transformers 18 and 20 each comprising a winding 22 and a variable capacitor 24 are connected to the input transducer 14 and the output transducer 16 respectively. Additionally, a direct current power supply 26 is electrically coupled to the quartz buffer rod 12 and to the zinc oxide crystal 10 to impress a direct current field thereacross.

The electrical connectors from the impedance matching transformers 18 and 20 were placed on the quartz buffer rod 12 by heating the rod 12 to about 350° C. and by vapor coating on a clean surface of the rod with nichrome and then gold. A good vapor coating will withstand thermal shifts down to about −100° C.

The electrical connectors on the input zinc oxide transducer 14, the output zinc oxide transducer 16 and the zinc oxide crystal 10 were placed on the crystal by sputtering using low energy sputtering techniques. First a layer of indium was sputtered on the crystal for good ohmic contact and the a layer of gold for good electrical conductivity.

Copper wire leads from the impedance matching transformers 18 and 20 and a copper lead from the direct current power supply 26 were bonded to the indium-gold and nichrome-gold electrodes by silver loading an epoxy resin to make the same conductive prior to curing of the resin. After curing, the silver bearing epoxy had good mechanical properties at about −100° C. while being conductive.

When an ultra high frequency electrical signal is applied to the impedance matching transformer 18, the electrical signal is converted by means of transducer 14 into an acoustic wave signal. The acoustic wave signal propagates down through the buffer rod 12 and is subsequently impressed upon the zinc oxide crystal 10 causing the acoustic wave signal to propagate along the *c*-axis in the compressional mode. A hgh voltage direct current signal is applied to the zinc oxide crystal 10 to produce a direct current field thereacross just before and during the time interval the acoustic wave signal is transversing the crystal 10. The output zinc oxide transducer 16 converts the amplified acoustic wave signal into an electrical signal and applies the same as an output to impedance matching transformer 20.

It is understood that the means for propagating an acoustic wave signal through the piezoelectric semiconductor includes the necessary elements for impressing an acoustic wave signal on the amplifying medium such as the buffer rod 12, the input zinc oxide transducer 14 and the impedance matching transformer 18. Further, it is contemplated as being within the scope of this invention to use other means for impressing or causing an ultrasonic or acoustic wave signal to be propagated through the zinc oxide crystal. Also, it is anticipated that the acoustic wave signal could be impressed in several modes such as, for example, the compression mode, the shear mode and the like. Additionally, the amplifying medium may be formed or fabricated into any shape, the important criteria being a unitary body.

In this particular embodiment, the means for propagating an acoustic wave signal through the zinc oxide crystal additionally includes a means for generating a radio frequency signal or a radio frequency signal generator 28. The high frequency electrical signal is applied via a precision attenuator 30 to the input impedance matching transformer 18. A pulse generator 32 produces a series of control pulses which modulate or control operation of the radio frequency signal generator 28. The series of control pulses from pulse generator 32 cause the radio frequency signal generator 28 to produce an ultra high frequency signal in the form of a series of pulses. The series of control pulses from the pulse generator 32 via a pulse delay 34 control operation of the direct current power supply 26. The control pulses are delayed by the pulse delay 34 for a predetermined time interval and applied to the power supply 26 producing a direct current pulse which establishes a direct current field across the crystal 10 concurrently with the acoustic wave signal propagating through the crystal 10.

Briefly, the operation of FIGURE 1 can be described as follows. The pulse generator 32 applies control pulses to both the radio frequency signal generator 28 and the pulse delay 34. The impedance matching transformer 18 receives and applies an ultra high frequency electrical signal pulse having a predetermined attenuation determined by attenuator 30 to the input zinc oxide transducer 14. The electrical signal pulses are converted into acoustic or ultrasonic wave signal pulses which are propagated through the buffer rod 12 to the zinc oxide crystal 10. As each acoustic wave signal pulse transverses the buffer rod 12 and is just about to reach the crystal 10, the direct current power supply 26 is triggered by a control pulse to produce a high voltage direct current pulse which establishes a direct current field across the crystal 10 during the time the acoustic wave signal pulse propagates therethrough.

The control pulse to the power supply 26 is delayed for a period equal to the time required for the ultra high frequency electrical signal pulse to be converted into an ultrasonic acoustic wave signal and propagated nearly completely through the buffer rod 12. As each acoustic wave signal pulse propagates through the crystal 10, that pulse produces a predetermined piezoelectric field within the crystal. The piezoelectric field produced by the acoustic wave signal pulse and the direct current field produced from the direct current pulse interact whereupon energy is transferred from the electrons to amplify the acoustic wave signal. The amplified acoustic wave signal is converted by means of output zinc oxide transducer 16 into an amplified electrical signal and is applied via impedance matching transformer 20 to a receiver 36.

Figure 2:
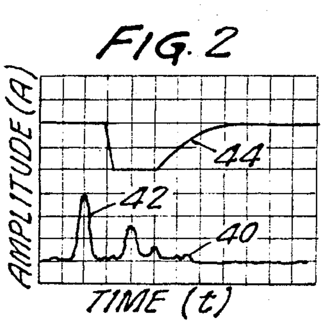
FIGURE 2 is a graph illustrating waveforms of an unamplified acoustic wave signal pulse when a direct current pulse which establishes the direct current field is out of phase with the acoustic wave signal for the embodiment of FIGURE 1.
Figure 3:
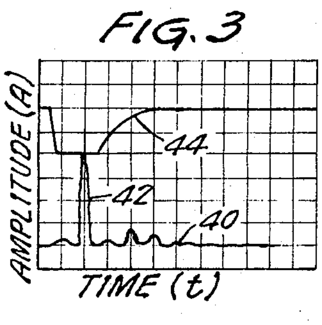
FIGURE 3 is a graph illustrating waveforms of an amplified acoustic wave signal when the direct current pulse produces a direct current field which is in phase with the propagated acoustic wave signal for the embodiment of FIGURE 1.

FIGURES 2 and 3 are graphs each of which illustrate waveforms of the high voltage direct current pulse, which produces the direct current field, and the acoustic wave signal pulse. Curve 40 in FIGURE 2 illustrates the signal propagating through crystal 10 with the acoustic wave signal pulse being identified as peak 42. The curve 40 is produced in response to the piezoelectric field established by compression of the crystal 10 by the acoustic wave signal propagating therethrough. Curve 44 of FIGURE 2 illustrates the waveform of a high voltage direct current pulse. In one embodiment, the direct current pulse had a maximum amplitude in the order of 1000 volts and a pulse duration of about four microseconds. When the direct current pulse 44 is out of phase and not coincident with the acoustic wave signal pulse 42, the crystal 10 produces no amplification. This is illustrated in FIGURE 2 by the direct current pulse 44 being shifted in time relative to the acoustic wave signal pulse 42.

When the direct current pulse 44 is in phase or in coincidence with the acoustic wave signal pulse 42 propagating through the crystal 10, the acoustic wave signal pulse is superlinearly amplified. This is illustrated by the abrupt increase in amplitude of acoustic wave signal pulse 42 in phase with the direct current pulse 44 illustrated in FIGURE 3.

In summary, it is necessary that the direct current pulse 44 be applied to the crystal 10 to produce a direct current field in coincidence with the acoustic wave signal pulse. The direct current field interacts with the piezoelectric field whereupon the crystal 10 momentarily changes its physical characteristics causing energy to be transferred from the direct current field to the acoustic wave signal pulse resulting in an amplified acoustic wave signal.

The maximum gain of the ultrasonic wave signal amplifier can be obtained by selectively varying the temperature of the crystal 10. When the temperature is varied to a preselected level, the crystal 10 exhibits a predetermined resistivity and Hall mobility thereby establishing the operating gain for the ultrasonic wave signal amplifier.

The advancement in the state-of-the-art is based upon the discovery that a zinc oxide crystal can be prepared having a uniformly high resistivity and a relatively high Hall mobility and be advantageously employed as the amplifying medium in a piezoelectric semiconductor transducer. For example, in one experiment the zinc oxide crystal exhibited a resistivity in the order of $10^4$ ohm-cm. and a Hall mobility in the order of 480 cm.$^2$/V-sec.

The zinc oxide single crystals of the prior art generally had a high resistivity at lower temperatures but concomitantly had an extremely low Hall mobility. When the resistivity of the prior art zinc oxide crystals increased rapidly with decreasing temperature, the Hall mobility decreased drastically, sometimes reaching values as low as 10 cm.$^2$/V-sec. Conversely, if the resistivity was found to change very little with decreasing temperature, the mobility then increased from room temperature values, sometimes reaching values as high as 350 to 500 cm.$^2$/V-sec. The prior art acoustic wave signal amplification devices using such zinc oxide single crystals were incapable of producing ultrasonic wave signal amplification approaching the amplification gain of the present invention.

A zinc oxide single crystal grown in certain gas atmospheres, such as for example nitrogen, produced a crystal containing impurities in its crystalline lattice. The impurities appeared to form from excess zinc combining with the gas molecules and the resulting impurities were observed to seriously affect both the electron mobility, including the Hall mobility, and the resistivity of the crystal. It is contemplated that sufficiently pure zinc oxide single crystals could be grown in gas atmospheres such as nitrogen having sufficiently high resistivity and a relatively high Hall mobility to be used as an amplifying medium.

However, the resistivity of the vapor grown zinc oxide crystal may be controlled in several ways. For example, the zinc oxide single crystal can be doped with an acceptor ion, such as lithium, to reduce the number of available conduction electrons. One problem associated with doping zinc oxide crystals is that the nonuniform zinc oxide crystals do not exhibit uniformity of resistivity throughout their bulk. When the zinc oxide crystal is doped, there is some tendency for the Hall mobility to be reduced. But, it appears that by proper doping techniques, zinc oxide single crystals can be produced which are uniformly doped with acceptor ions such that a controlled uniformity of resistivity and a desired Hall mobility can be obtained.

It was discovered that zinc oxide single crystals grown in a vapor phase within an inert gas atmosphere, such as for example argon, were capable of exihibting a high resistivity and a relatively high Hall mobility of electrons each of which was characterized to be capable of increasing as an inverse function of temperature at certain predetermined conditions.

The resistivity and Hall mobility of the zinc oxide crystal vapor grown in the argon gas atmosphere is obtained by cooling the crystal 10 until the desired value of resistivity is obtained. Concurrently, an acceptable Hall mobility is obtained when the desired value of resistivity is reached.

Based on the teachings of this invention, selection of a zinc oxide single crystal as an amplifying medium in a piezoelectric semiconductor transducer wherein the zinc oxide crystal exhibited a high resistivity and a relatively high Hall mobility each of which vary inversely as a function of temperature is crucial.

Figure 4:
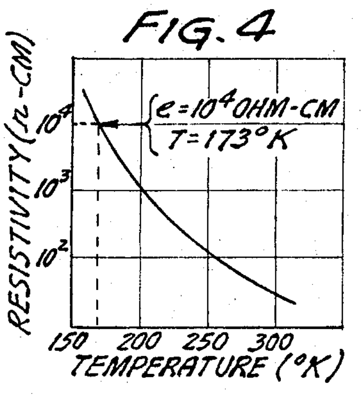
FIGURE 4 is a graph illustrating the resistivity of a zinc oxide crystal amplifying medium plotted as a function of temperature.

FIGURE 4 is a graph illustrating the resistivity of a zinc oxide single crystal as a function of temperature. The resistivity is represented in ohm-cm. while the temperature is represented in ° K. A resistivity of $10^4$ ohm-cm. can be obtained at about −100° C., or about 173° K. An increase in temperature causes the resistivity, which is inversely proportional to temperature, to decrease.

Figure 5:
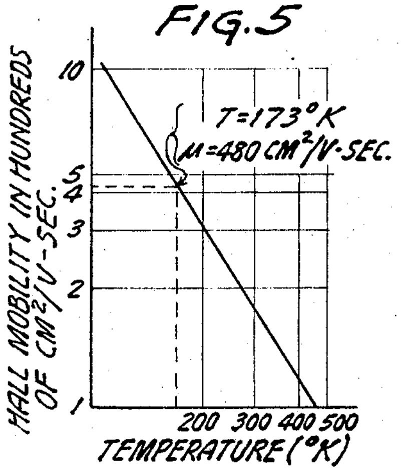
FIGURE 5 is a graph illustrating the Hall mobility of the zinc oxide crystal of FIGURE 4 plotted as a function of temperature.

FIGURE 5 is a graph illustrating the Hall mobility in hundreds of cm.$^2$/V-sec. which is plotted as a function of temperature in ° K. A Hall mobility of about 480 cm.$^2$/V-sec. was obtained at a temperature of about 173° K. as depicted in FIGURE 4 for the same zinc oxide crystal having a resistivity of $10^4$ ohm-cm.

Figure 6:
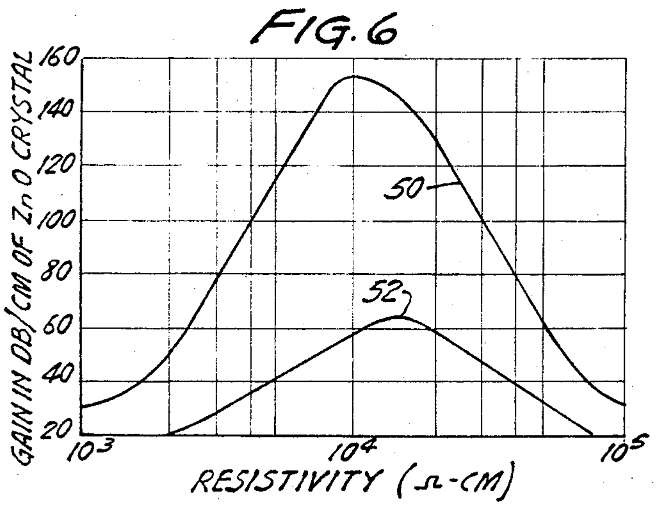
FIGURE 6 is a graph illustrating theoretical gains of a zinc oxide crystal under selected operating conditions plotted as a function of resistivity.

Theoretical gain curves for a compressional wave amplifier and for a shear wave amplifier are plotted as a function of resitivity in FIGURE 6 and are identified as curves 50 and 52 respectively. The gain of a piezoelectric semiconductor transducer can be determined from the following Equation 1:

$$G=8.68\frac{k_{ij}{}^2\pi f_0}{v_s}\frac{(1-\beta)\frac{f_c}{f_0}}{(1-\beta)^2+\left(\frac{f_c}{f_0}+\frac{f_0}{f_D}\right)^2} \qquad (1)$$

where

G=gain in db/cm., $k_{ij}$=appropriate electromechanical coupling coefficient, $v_s$=velocity of sound for a given type wave, $$\beta=\frac{v_d}{v_s}=\frac{\mu_e E}{v_s}$$

$v_d$=drift velocity of the electrons, $\mu_e$=drift mobility of the electrons,
E=electric field,
$f_o$=operating frequency,
$f_c=\sigma/2\pi\epsilon$=dielectric relaxation frequency,
$\sigma$=conductivity,
$\epsilon$=dielectric constant,
$f_D=v_s^2q/2\pi f\mu_e kT$=diffusion frequency,
$f$=trapping factor (ideally equal to unity),
$q$=electronic charge,
$k$=Boltzmann constant,
T=absolute temperature.

The maximum gain for a given applied direct current voltage is determined by Equation 2:

$$f_m=(f_c\times f_D)^{1/2} \quad (2)$$

The term "high resistivity" as used herein means the resistivity of the amplifying medium at the frequency of the ultrasonic or amplified wave signal at which the transducer is operating to produce a desired gain which may or may not be optimized at maximum gain. If the frequency of the signal to be amplified is relatively low, say for example in the order of about 100 mc.p.s. to about 1 kmc.p.s., the resistivity is selected primarily based upon the ratio of $f_c$ to $f_o$. If the frequency is greater than about 1 kmc.p.s., the resistivity is selected based upon the ratio of $f_c$ to $f_o$ and the ratio of $f_o$ to $f_D$.

The terms $f_c$, $f_o$ and $f_D$ used in defining "high resistivity" means the following:

$f_c=\sigma/2\pi\epsilon$=dielectric relaxation frequency,
$f_o$=operating frequency,
$f_D=v_s^2q/2\pi f\mu_e kT$=diffusion frequency, Both the gain curve for the compressional wave amplifier and for the shear wave amplifier as a function of resistivity were calculated assuming a temperature of −100° C. For purposes of plotting the curves in FIGURE 6, the following values were used:

$k_{33}$=47.8%,
$k_{15}$=20.5%,
$\epsilon_{33}$=10.9,
$\epsilon_{11}$=8.5,
Operating frequency=30 mc.p.s.,
Hall mobility=250 cm.$^2$/V-sec.,
$v_d=1.5\times v_s$ As evidenced by the theoretical gain in db of the zinc oxide crystal plotted as a function of resistivity in ohm-cm. appeared to give maximum theoretical gain of about 150 db/cm. in the compressional mode. However, in the shear wave mode the maximum resistivity occurring at slightly greater than $10^4$ ohm-cm. is slightly higher than that of the compression mode giving a theoretical gain of slightly greater than 60 db/cm.

In an experiment using the embodiment of FIGURE 1, and undoped, argon grown, zinc oxide single crystal was selected having a resistivity of nearly $10^4$ ohm-cm. at about −100° C. and a measured Hall mobility of about 480 cm.$^2$/V-sec. A section of this zinc oxide crystal was sliced and polished to a length of about .068 inch (about 1.72 millimeters) along its *c*-axis and a cross-sectional dimension of about .15 inch (about four millimeters). After electroding with indium and gold as described hereinbefore, the crystal was mounted as described in connection with FIGURE 1. Two zinc oxide Z cut transducers were used to produce a 30 mc.p.s. compressional acoustic wave signal.

The entire ultrasonic wave signal amplifier was cooled by dry nitrogen gas. At about −60° C., a high voltage direct current pulse was applied to the crystal causing a direct current field across the crystal coincidently with the acoustic wave signal pulse. A significant suppression of the radio frequency signal occurred. Since $\beta$, described in connection with Equation 1, was less than 1, the attenuation was expected. When the amplifier was cooled to about −94° C, and both the acoustic wave signal pulse and the direct current pulse were applied to the crystal coincidently, a 9 db gain was observed resulting in a relative gain of 53 db/cm. The electron drift mobility was calculated to be about 250 cm.$^2$/V-sec. It was anticipated that the measured electron drift velocity was less than the Hall mobility due to traps and impurities.

It is also contemplated that the piezoelectric semiconductor transducer of the present invention could be used as an ultrasonic or acoustic wave signal delay line having a relatively low loss coefficient. A low loss delay line is fabricated by designing the device to delay the high frequency signal by a predetermined time interval and to amplify the delayed signal to a sufficient level to compensate for internal losses within the device. Thus, an ultra high frequency signal can be delayed with substantially little, if any, attenuation. The predetermined time interval of the delay can be precisely controlled either by delaying the signal directly as a function of amplifying medium length, by producing standing acoustic wave signal patterns with the device or by a combination thereof.

It is understood that the above-described embodiment relating to a piezoelectric semiconductor ultrasonic amplifier utilizing a zinc oxide single crystal having a high resistivity and relatively high Hall mobility. As the amplifying medium is exemplary and any modifications, changes, equivalents and the like are deemed to be within the scope of the appended claims.

What is claimed is:

1. A piezoelectric semiconductor device for producing acoustic wave signal amplification comprising an amplifying medium having both piezoelectric and semiconductor properties and which is formed into a unitary body, said medium being selected to have a high resistivity and a relatively high Hall mobility each of which vary inversely as a function of temperature;

means for propagating an acoustic wave signal through said amplifying medium to produce a piezoelectric field in a predetermined direction within said medium; and means operatively coupled to said medium for establishing a direct current field across said medium in coincidence with and in the same predetermined direction as said piezoelectric field, said piezoelectric field interacting with said direct current field to amplify said acoustic wave signal propagating therethrough.

2. The device of claim 1 further comprising means responsive to said propagating means for modulating said acoustic wave signal into a series of pulses; and wherein said direct current field means includes;

means operatively coupled to said medium for applying direct current pulses across said medium to establish a direct current field in phase with said piezoelectric field produced by each acoustic wave signal pulse thereby amplifying each of said acoustic wave signal pulses.

3. An ultrasonic wave signal amplifier comprising a unitary body having both piezoelectric and semiconductor properties, said body being selected to have a high resistivity and a relatively high Hall mobility each of which vary as an inverse function of temperature;

means for propagating an ultrasonic wave signal through said body to produce a piezoelectric field; and means adapted to be energized from a direct current power supply for coincidently establishing a direct current field in said body as said ultrasonic wave signal is propagated therethrough.

4. The amplifier of claim 3 where in said body is a zinc oxide single crystal.

5. The amplifier of claim 4 wherein said zinc oxide single crystal is vapor grown in an inert gas atmosphere.

6. The amplifier of claim 5 wherein said inert gas atmosphere is argon.

7. The amplifier of claim 3 wherein said body is a zinc oxide single crystal which has been doped with an acceptor ion to reduce the number of available conduction electrons thereby increasing the resistivity of said crystal.

8. The amplifier of claim 3 further including means adapted for varying the temperature of said body to a predetermined temperature level to establish a predetermined resistivity and Hall mobility for amplifying said ultrasonic wave signal propagating therethrough to a maximum level.

9. An ultra high frequency signal amplifier comprising a zinc oxide single crystal having a high resistivity and a relatively high Hall mobility each being inversely proportional to temperature;

means for propagating an ultra high frequency signal as an acoustic wave signal having a certain amplitude in an axial direction along said crystal and in a compressional mode to generate a piezoelectric field in said axial direction; and means including a direct current power supply for establishing a predetermined direct current field in said axial direction within said crystal in coincidence with said piezoelectric field generated by said acoustic wave signal, said piezoelectric field and said direct current field inter acting causing an energy transfer from said direct current field to said piezoelectric field to momentarily change the characteristics of said crystal to increase said amplitude of the acoustic wave signal being propagated therethrough.

10. The amplifier of claim 9 wherein said propagating means includes means for generating an ultra high frequency signal as an electrical signal; and means responsive to said generating means for converting said ultra high frequency electrical signal into an acoustic wave signal and applying said acoustic wave signal to said crystal in said axial direction for amplification.

11. The amplifier of claim 10 further including means operatively coupled to said crystal for converting said amplified acoustic wave signal into an electrical signal.

12. The amplifier of claim 9 wherein said means for propagating said acoustic wave signal produces a signal frequency above 100 megacycles.

13. An ultra high frequency signal amplifier comprising a zinc oxide single crystal having a high resistivity and a relatively high Hall mobility each being inversely proportional to temperature;

means for propagating an ultra high frequency signal as an acoustic wave signal having a certain amplitiude in a predetermined direction along said crystal and in a shear mode to generate a piezoelectric field in said predetermined direction; and means including a direct current power supply for establishing a predetermined direct current field in said predetermined direction within said crystal in coincidence with said piezoelectric field generated by said acoustic wave signal, said piezoelectric field and said direct current field interacting causing an energy transfer from said direct current field to said piezoelectric field to momentarily change the characteristics of said crystal to increase said amplitude of the acoustic wave signal being propagated therethrough.

14. The amplifier of claim 13 wherein said propagating means includes means for generating an ultra high frequency signal as an electrical signal; and means responsive to said generating means for converting said ultra high frequency electrical signal into an acoustic wave signal and applying said acoustic wave signal to said crystal in said predetermined direction for amplification.

15. The amplifier of claim 14 further including means operatively coupled to said crystal for converting said amplified acoustic wave signal into an electrical signal.

16. A piezoelectric semiconductor delay line for delaying an acoustic wave signal comprising an amplifying medium having both piezoelectric and semiconductor properties, said medium being formed into a unitary body having a predetermined shape and being selected to have a high resistivity and a relatively high Hall mobility each of which vary as an inverse function of temperature;

means for propagating an ultrasonic wave signal through said medium in a predetermined manner so as to delay said acoustic wave signal for a predetermined time interval and to produce a piezoelectric field within said medium; and means adapted to be energized from a direct current power supply for coincidentaly establishing a direct current field in said medium as said acoustic wave signal is propagated therethrough to amplify said acoustic wave signal in an amount sufficient to compensate for attenuation losses imparted to said delayed acoustic wave signal by said delay line during said predetermined time interval.

References Cited

UNITED STATES PATENTS 3,173,100 3/1965 White ............... 330—5.5

OTHER REFERENCES

May: "Proc. IEEE," October 1965, pp. 1565–1585.

ROY LAKE, *Primary Examiner.*

DARWIN R. HOSTETTER, *Assistant Examiner.*

U.S. Cl. X.R.

333—30

UNITED STATES PATENT OFFICE

CERTIFICATE OF CORRECTION

February 18, 1969

Patent No. 3,428,907

Dale F. Crisler

It is certified that error appears in the above identified patent and that said Letters Patent are hereby corrected as shown below:

Column 3, line 69, "the" should read -- then --. Column 4, line 74, after "ultrasonic" insert -- or --. Column 7, line 48, after "cm." insert -- , a resistivity in the order of $10^4$ ohm-cm. --.

Signed and sealed this 24th day of March 1970.

(SEAL)
Attest:

Edward M. Fletcher, Jr.
Attesting Officer

WILLIAM E. SCHUYLER, JR.
Commissioner of Patents